[19] United States Patent
Morkoc et al.

[11] Patent Number: 4,872,046
[45] Date of Patent: Oct. 3, 1989

[54] HETEROJUNCTION SEMICONDUCTOR DEVICE WITH <001> TILT

[75] Inventors: Hadis Morkoc; Russ Fischer, both of Urbana, Ill.

[73] Assignee: University of Illinois, Urbana, Ill.

[21] Appl. No.: 91,631

[22] Filed: Sep. 1, 1987

Related U.S. Application Data

[62] Division of Ser. No. 822,343, Jan. 24, 1986, Pat. No. 4,707,216.

[51] Int. Cl.[4] .............................................. H01L 29/04
[52] U.S. Cl. ........................................ 357/60; 357/16;
357/17; 357/34; 357/22
[58] Field of Search ..................... 357/16, 17, 34, 22, 357/60

[56] References Cited

U.S. PATENT DOCUMENTS 3,476,592  11/1969  Berkenblit et al. ................ 117/201
3,920,492  11/1975  Sugita et al. ...................... 357/60 X

FOREIGN PATENT DOCUMENTS 59-22319  2/1984  Japan .
59-22320  2/1984  Japan .

OTHER PUBLICATIONS

Fischer et al., "Characteristics of GaAs/AlGaAs MODFETS Grown Directly on (100) Silicon," Electronics Letters, 25 Oct. 84, vol. 20, No. 22, pp. 945-947.
Kemlage, "Deposition of a GaP Heteroepitaxy on Silicon," IBM Technical Disclosure Bulletin, vol. 18, No. 6, Nov. 1975, p. 1852.
Gourley et al., "Photoluminescence Microscopy of Epitaxial GaAs on Si," Appl. Phys. Lett. 51 (8), 24 Aug. 1987, pp. 599-601.
Windhorn et al., "A GaAs Double-Heterostructure Diode Lasers Fabricated on a Monolithic GaAs/Si Substrate," Appl. Phys. Lett. 45 (4), 15 Aug. 1984, pp. 309-310.
Mazur et al., "TEM Combined with $AL_xGa_{1-x}$ as Marker Layers as a Technique for the Study of GaAs MBE Growth," Mat. Res. Soc. Symp. Proc., vol. 37, 1985, pp. 1-15.
Mazur et al., "TEM Investigation of Polar-on-Nonpolar Epitaxy; GaAs—AlGaAs on (100)Ge," presented at the Materials Research Soc. Meeting, Boston, MA, Nov. 26-30, 1984, 1-4.
Metze et al., "Metal-Semiconductor Field Effect Transistors Fabricated in Gas as Layers Grown Directly on Si Substrates by Molecular Beam Epitaxy," Appl. Phys. Lett., 45(10) Nov. 1984, 1107-1109.
Kaplan, "Leed Study of the Stepped Surface of Vicinal Si(100)," Surface Science, 93(1980), pp. 145-158.
Hollan et al., "Difference Between the (001) Facet and the Vicinal Planes in Vapour Phase Epitaxal Growth of GaAs," Jour. of Crystal Growth, 22(1974), 175-180.
Uppal et al., "Molecular Beam Epitaxial Growth of GaAs on Si(211)," J. Appl. Phys., 58(6), 15 Sep. 1985, 2195-2203.
Fischer et al., "GaAs Bipolar Transistors Grown on (100) Si Substrates by Molecular Beam Epitaxy," Appl. Phys. Lett. 47(4), 15 Aug. 1985, 397-399.
Fischer et al., "GaAs/AlGaAs MODFET's Grown on (100) Ge," IEEE Electron Device Letters, vol. EOL-5, No. 11, Nov. 1984, pp. 456-457.
Fletcher et al., "GaAs Light-Emitting Diodes Fabricated on Ge-Coated Si Substrates," Appl. Phys. Lett. 44(10), 15 May 1984, pp. 967-968.
Miller et al., "Molecular Beam Epitaxial GaAs Heteroface Solar Cell Grown on Ge," Appl. Phys. Lett. 37(12), 15 Dec. 1980, pp. 1104-1106.

(List continued on next page.)

Primary Examiner—William Mintel
Attorney, Agent, or Firm—Martin Novack

[57] ABSTRACT

A method is disclosed of epitaxially depositing a semiconductor material on a substrate of different material while accommodating lattice mismatch in a manner that results in improved epitaxially deposited material. In a disclosed embodiment GaAs is epitaxially deposited by molecular beam epitaxy on a silicon substrate having a {100} crystallographic surface tilted in the <001> direction. Improved semiconductor devices, made using the disclosed technique, are also set forth.

12 Claims, 4 Drawing Sheets

OTHER PUBLICATIONS

Wright et al., "Polar-on-Nonpolar Epitaxy: Sublattice Ordering in the Nucleation and Growth of GaP on Si(211) Surfaces," *J. Vac. Sci. Technol.* 21(2), July/Aug. 1982, 534–539.

"Growing GaAs on Silicon", IEEE Spectrum, Apr., 1986, p. 25.

Hollan, L. and C. Schiller, "Difference Between the (001) Facet and the Vicinal Planes in Vapour Phase Epitaxial Growth of GaAs", Journal of Crystal Growth, 22 (1974), 175–180.

Matthews, J. W. and A. E. Blakeslee, "Defects in Epitaxial Multilayers", Journal of Crystal Growth, 29 (1975), 273–280.

Morizane, Kenji, "Antiphase Domain Structures in GaP and GaAs Epitaxial Layers Grown on Si and Ge", Journal of Crystal Growth, 38 (1977), 249–254.

Petroff, P. M., A. C. Gossard, A. Savage and W. Wiegmann, "Molecular Beam Epitaxy of Ge and $Ga_{1-x}Al_xAs$ Ultra Thin Film Superlattices", Journal of Crystal Growth, 46 (1979), 172–178.

Kaplan, Ray, "Leed Study of the Stepped Surface of Vicinal Si(100)", Surface Science, 93 (1980), 145–158.

Miller, D. L. and J. S. Harris, Jr., "Molecular Beam Epitaxial GaAs Heteroface Solar Cell Grown on Ge", Appl. Phys. Lett., 37 (12), 15 Dec. 1980, 1104–1106.

Aspnes, D. E. and A. A. Studna, "Chemical Etching and Cleaning Procedures for Si, Ge, and Some III–V Compound Semiconductors", Appl. Phys. Lett., 39 (4), Aug. 15, 1981, 316–318.

Wright, Steven L., Masanori Inada, and Herbert Kroemer, "Polar-On-Nonpolar Epitaxy: Sublattice Ordering in the Nucleation and Growth of GaP on Si(211) Surfaces", J. Vac. Sci. Technol., 21 (2), Jul./Aug. 1982, 534–539.

Wright, Steven L., Herbert Kroemer, and Masanori Inada, "Molecular Beam Epitaxial Growth of GaP on Si", J. Appl. Phys., 55 (8), Apr. 15, 1984, 2916–2927.

Christou, A., E. D. Richmond, B. R. Wilkins, and A. R. Knudson, "Surface Treatment of (1102) Sapphire and (100) Silicon for Molecular Beam Epitaxial Growth", Appl. Phys. Lett., 44 (8), Apr. 15, 1984, 796–798.

Fletcher, Robert M., D. Ken Wagner, and Joseph M. Ballantyne, "GaAs Ligh-Emitting Diodes Fabricated on Ge-Coated Si Substrates", Appl. Phys. Lett., 44 (10), 15 May, 1984, 967–969.

Wang, W. I., "Molecular Beam Epitaxial Growth and Material Properties of GaAs and AlGaAs on Si(100)", Appl. Phys. Lett., 44 (12), Jun. 15, 1984, 1149–1151.

Sheldon, P. and K. M. Jones; R. E. Hays, B-Y. Tsaur and John C. C. Fann, "Growth and Patterning of GaAs/Ge Single Crystal Layers on Si Substrates by Molecular Beam Epitaxy", Appl. Phys. Lett., 45 (3), Aug. 1, 1984, 274–276.

Fischer, R., T. Henderson, J. Klem, W. T. Masselink, W. Kopp, H. Morkoc, and C. W. Litton, "Characteristics of GaAs/AlGaAs MODFETs Grown Directly on (100) Silicon", Electronics Letters, 20 (22), Oct. 25, 1984, 945–947.

Fischer, R., J. Klem, T. Henderson, W. T. Masselink, W. Kopp, and H. Morkoc, "GaAs/AlGaAs MODFET's Grown on (100) Ge", IEEE Electron Device Letters, vol. EDL-5, No. 11, Nov. 1984, 456–457.

Metze, G. M., H. K. Choi, and B-Y. Tsaur, "Metal-Semiconductor Field-Effect Transistors Fabricated in GaAs Layers Grown Directly on Si Substrates by Molecular Beam Epitaxy", Appl. Phys. Lett., 45 (10), Nov. 15, 1984, 1107–1109.

Mazur, J. H., J. Washburn, T. Henderson, J. Klem, W. T. Masselink, R. Fischer, and H. Morkoc, "TEM Investigation of Polar-on-Nonpolar Epitaxy: GaAs-AlGaAs on (100) Ge", presented at the Materials Research Society Meeting, Boston, MA, Nov. 26–30, 1984.

Masselink, W. T., T. Henderson, J. Klem, R. Fischer, P. Pearah, and H. Morkoc; M. Hafich, P. D. Wang, and G. Y. Robinson, "Optical Properties of GaAs on (100) Si Using Molecular Beam Epitaxy", Appl. Phys. Lett., 45 (12), Dec. 15, 1984, 1309–1311.

Mazur; J. H., J. Washburn, T. Henderson, J. Klem, W. T. Masselink, R. Fischer, and H. Morkoc, "TEM Investigation of Polar-on-Nonpolar Epitaxy: GaAs—AlGaAs on (100) Ge", Mat. Res. Soc. Symp. Proc., vol. 37, 1985, Materials Researchy Society.

Mazur, J. H., J. Washburn, T. Henderson, J. Klem, W. T. Masselink, R. Fischer, and H. Morkoc, "Structure of the Si-GaAs Interface: Polar on Nonpolar Epitaxy", Proceedings of the 43rd Annular Meeting of the Electron Microscopy Society of America, 1985, 366–367.

Windhorne, T. H. et al., "AlGaAs Double-Heterostructure Diode Lasers Fabricated on a Monolithic GaAs/Si Substrate", Appl. Phys. Lett., 45(4), Aug. 15, 1984.

(List continued on next page.)

OTHER PUBLICATIONS

Mazur, J. H., J. Washburn, R. Fischer, T. Henderson, J. Klem, W. T. Masselink, W. Kopp, and H. Morkoc, "TEM Combined with $Al_xGa_{1-x}As$ Marker Layers as a Technique for the Study of GaAs MBE Growth", presented at the Arizona State University Centennial Symposium on High Resolution Electron Microscopy, Scottsdale, AZ, Jan. 7–11, 1985.

Masselink, W. T., R. Fischer, J. Klem, T. Henderson, and H. Morkoc, "GaAs/AlGaAs Multiquantum Wells Grown on Nonpolar Semiconductor Substrates", J. Vac. Sci. Technol., B 3(2), Mar./Apr. 1985, 548–551.

Morkoc, H., C. K. Peng, T. Henderson, W. Kopp, R. Fischer, L. P. Erickson, M. D. Longerbone, and R. C. Youngman, "High-Quality GaAs MESFIT's Grown on Silicon Substrates by Molecular-Beam Epitaxy", IEEE Electron Device Letters, vol. EDL-6, No. 7, Jul. 1985, 381–383.

Fischer, R., W. T. Masselink, J. Klem, T. Henderson, T. C. McGlinn, M. V. Klein, and H. Morkoc; J. H. Mazur and J. Washburn, "Growth and Properties of GaAs/AlGaAs on Nonpolar Substrates Using Molecular Beam Epitaxy", J. Appl. Phys., 58 (1), Jul. 1, 1985, 374–381.

Fischer, R., N. Chand, W. Kopp, and H. Morkoc; L. P. Erickson and R. Youngman, "GaAs Bipolar Transistors Grown on (100) Si Substrates by Molecular Beam Epitaxy", Appl. Phys. Lett., 47 (4), Aug. 15, 1985, 397–399.

Uppal, Parvez N. and Herbert Kroemer, "Molecular Beam Epitaxial Growth of GaAs on Si(211)", J. Appl. Phys., 58 (6), Sep. 15, 1985, 2195–2203.

Ishazaka et al., "Low Temperature Surface Cleaning of Silicon and its Application to Silicon MBE", Proceedings of 2nd International Symposium on Molecular Beam Epitaxy and Related Clean Surface Techniques, Tokyo, 1982.

Pond et al., "A General Treatment of Antiphase Domain Formation and Identification at Polar-Nonpolar Semiconductor Interfaces".

HETEROJUNCTION SEMICONDUCTOR DEVICE WITH <001> TILT

This invention was made with Government support under contract F49620-83-K-0021 awarded by the United States Air Force. The Government has certain rights in this invention.

This is a division of copending U.S. application Ser. No. 822,343 filed Jan. 24, 1986 now U.S. Pat. No. 4,707,216.

BACKGROUND OF THE INVENTION

This invention relates to a method for epitaxial growth of semiconductor materials, such as a III-V semiconductor epitaxially grown on silicon or germanium. The invention also relates to semiconductor devices formed using the disclosed method.

The ability to grow polar semiconductors, such as GaAs or other III-V materials, on non-polar substrates, such as Si or Ge, has been recognized as highly desirable for some time. The III-V semiconductors are well known to exhibit superior performance characteristics, in many respects, as compared to the more common silicon, but there are a number of difficulties associated with processing III-V semiconductor materials. For example, high quality GaAs substrates of large size are not available at practical cost and are very fragile. In contrast, large silicon wafers are relatively sturdy and inexpensive. If GaAs could be readily grown on Si without undue defects, large GaAs working areas would be available for device production. Among other reasons advanced for growing III-V's on Si are: the possibility of integrated circuits using Si technology but with optical components; and the heat sinking of III-V devices grown on Si due to the higher thermal conductivity of Si. Also, oval defect densities are reduced when starting with a Si substrate.

It has been recognized that there are at least two major problems in epitaxially growing GaAs on Si. First, there is a lattice mismatch between Ga and Si (about 4% for this case). This results in a large number of defects in the interface, which could propagate in the epilayer. Second, antiphase disorder results from both Ga and As atoms being able to bond to a given site on the nonpolar (Si) surface. In some regions the growth begins with the Ga plane, and in other regions growth begins with the As plane. Similar problems are present for growth of other polar semiconductors on non-polar Si or Ge. Some of the background prior art techniques directed to these problems will now be summarized.

In early reports of epitaxial III-V layers on elemental Si or Ge substrates, it was found that antiphase domains occurred in these layers grown by vapor phase epitaxy. (See K. Morizane, Journal of Crystal Growth, 38, 249, 1977.) A drawback of using vapor phase epitaxy for these materials is that it requires a relatively high growth temperature. With the advent of molecular beam epitaxy, which is a much lower temperature process, attempts to grow superlattices of Ge and GaAs resulted in antiphase domain formation. (See P. M. Petroff, et al., Journal of Crystal Growth 46, 172, 1979.)

It was shown that GaAs can be successfully grown by molecular beam epitaxy on (100) Ge by using an As priming layer and an initially large As:Ga flux ratio (see Masselink, et al., Appl. Phys. Lett. 45, 457, 1984 and W. I. Wang, Appl. Phys. Lett. 44, 1149, 1984).

In another approach (see Wright, et al., J. Vac. Sci and Technol. 21, 534, 1982), a silicon (211) surface orientation was found effective in suppressing antiphase disorder. However, the (211) surface would not work well in a monolithically integrated GaAs/Si system. Another drawback is that the orientation must be almost exactly (211), thereby leaving little tolerance for misalignment when cutting wafers.

With regard to dislocations resulting from lattice mismatch, one approach was to use a Ge interlayer between {100} silicon and the GaAs (see, for example, Fletcher, et al., Applied Phys. Lett. 44, 967, 1984 and Sheldon, et al., Appl. Phys. Lett. 45, 274, 1984). A drawback of this technique, however, is Ge contamination of the GaAs.

It has been shown that tilting of substrates can be used advantageously when epitaxially depositing GaAs. Hollan, et al. (J. Crystal Growth, 22, 175, 1974) studied vapor phase epitaxy of GaAs on GaAs, with misorientations reaching 5 degrees in all directions around the (001) plane. Regarding GaAs on Si, applicants noted that using substrates tilted away from the (100) plane, such as by ½ degree or 2 degrees, resulted in reduction of antiphase domains and obtainment of uniformly good GaAs across the substrate. (See Masselink, et al., Appl. Phys. Lett. 45, 12, 1984). A tilt toward <011> was used by applicants in this work. Windhorn, et al., of Lincoln Laboratory, (Appl. Phys. Lett., 45, 4, 1984) reported on growing GaAs and AlGaAs layers on a Ge-coated Si wafer oriented 2° off {100} toward the <110> direction. Metze, et al. (Appl. Phys. Lett. 45, 10, 1984), also of Lincoln Laboratory, reported GaAs layers grown by molecular beam epitaxy directly on Si (100) substrates oriented 2 degrees off (100), without specifying the direction off tilt. Sheldon, et al. (Appl. Phys. Lett. 45, 3, 1984) used molecular beam epitaxy to grow GaAs on Si substrates with an intermediate Ge layer. The Si substrates used by Sheldon, et al. were heavily doped p-type oriented 2 degrees off the (100) towards the [111] direction.

It is among the objects of the present invention to provide an improved method of epitaxially depositing semiconductor material on a substrate while accommodating lattice mismatch in a way that results in improved material quality.

SUMMARY OF THE INVENTION

In GaAs on Si layers, it has been found that there are two types of edge dislocations, which can be referred to as type I and II, respectively. A type I dislocation has its Burgers vector in the plane of the nominal substrate orientation, and thus the dislocation line does not propagate into the epitaxial overlayer. This type of dislocation also has more energy associated with it, and is more effective in accommodating mismatch between the substrate and the epitaxial layer than does the type II dislocation. A type II dislocation has its Burgers vector inclined with respect to the substrate plane and therefore the dislocation line can propagate into the epitaxial layer and degrade its quality. Since the type II dislocation is less effective in accommodating mismatch, more of them are required to accommodate a given amount of mismatch than the type I.

In order to preferentially generate type I dislocations tilted orientations have been used for the Si substrate. FIG. 1 illustrates in cross sectional view what the tilting in the <011> direction does to the substrate surface. FIG. 1A illustrates the surface of a substrate with exact (100) orientation. FIG. 1B shows the same substrate, but with its top surface tilted at a small angle from the nominal (100) orientation, toward the <011> direction, as has been done in the prior art. In the case of FIG. 1B, steps occur in the surface due to the discrete atomic nature of the crystal The ledges created by these steps serve as sites where dislocations of type I can be generated, and hence by using a tilted orientation, dislocation densities in the epitaxial layer are reduced For a 4% lattice mismatch, as is the case between GaAs and Si, one type I dislocation must occur every 25 atomic planes. A tilt of 1.6° would produce one ledge every 25 atomic planes and therefore would be barely sufficient to provide enough sites for dislocation generation. Also, the steps do not necessarily occur at regular intervals, and therefore, to ensure that only a negligible number of steps are spaced by more than 25 planes, tilt angles towards <011> of 2° and 4°, for example, were used successfully.

The steps shown in FIG. 1B only run along one direction and, as a result, only control dislocations along one direction, <011>. (This includes the equivalent directions [011], [01$\bar{1}$], [0$\bar{1}$1], [0$\bar{1}\bar{1}$].) Applicants have discovered, however, that if a tilt towards the <001> direction (which includes the equivalent directions [001], [00$\bar{1}$], [010] and [0$\bar{1}$0]) is used, then steps run in two directions, as shown in FIG. 2. More sites are available and there is less propogation of dislocations up into the epitaxial layer, so important further reductions in dislocation density in the epitaxial layer can be achieved These directions are respectively at 45° with respect to <011>, as seen in FIG. 2.

In accordance with the method of the invention, there is provided a technique for forming a layer of semiconductor material of improved quality, comprising the steps of: providing a single crystalline silicon or germanium substrate having a {100} crystallographic surface tilted in the <001> direction; and epitaxially depositing a different single crystalline semiconductor material over said surface to obtain a layer of the different semiconductor material.

In a preferred form of the invention, the epitaxial deposition is performed by molecular beam epitaxy. The different single crystalline semiconductor material (i.e., different than the substrate material) is generally, although not necessarily, a III-V semiconductor material such as gallium arsenide, although the invention also has application to, for example, germanium-on-silicon.

In a preferred embodiment of the invention, gallium arsenide is epitaxially deposited over silicon tilted, in one of the designated directions, by at least 2.29 degrees. The gallium arsenide can be deposited directly on the silicon, or, as described, can be deposited over the silicon with intervening layers, including an arsenic prelayer, one or more strained layers which further reduce misfit dislocation densities, etc.

The invention is also directed to semiconductor devices formed in single crystalline semiconductor material disposed over a single crystalline silicon or germanium substrate having a {100} crystallographic surface tilted in the <001> direction. As described hereinbelow, transistor devices and light emitting devices can be formed in this manner. For such devices involving III-V semiconductor over silicon, performance is comparable to III-V devices formed on polar substrates (e.g. GaAs on GaAs). The quality improvement over the use of tilt toward the <011> direction has been striking, and results in a reduction by two-thirds in dislocations in the epitaxial layer.

Further features and advantages of the invention will become more readily apparent from the following detailed description when taken in conjunction with the accompanying drawings.

DESCRIPTION OF THE PREFERRED EMBODIMENTS

Figure 1A:
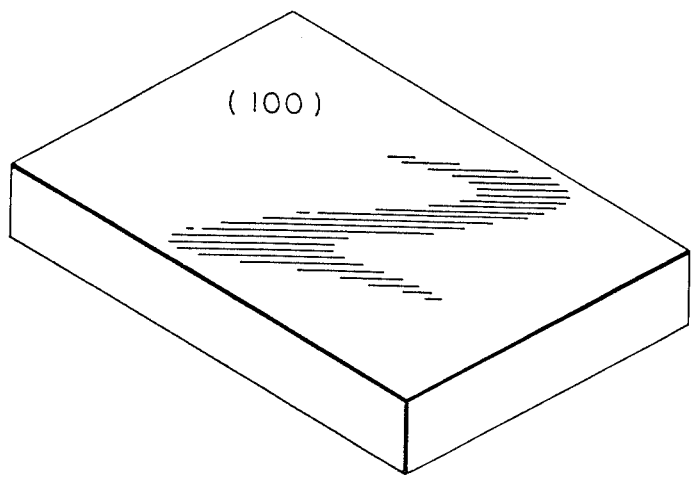
FIG. 1 shows, in 1A, a substrate of (100) orientation, and, in 1B, a representation of a small portion of the surface of the substrate tilted by a small angle from the nominal (100) orientation, toward the <011> direction.
Figure 1B:
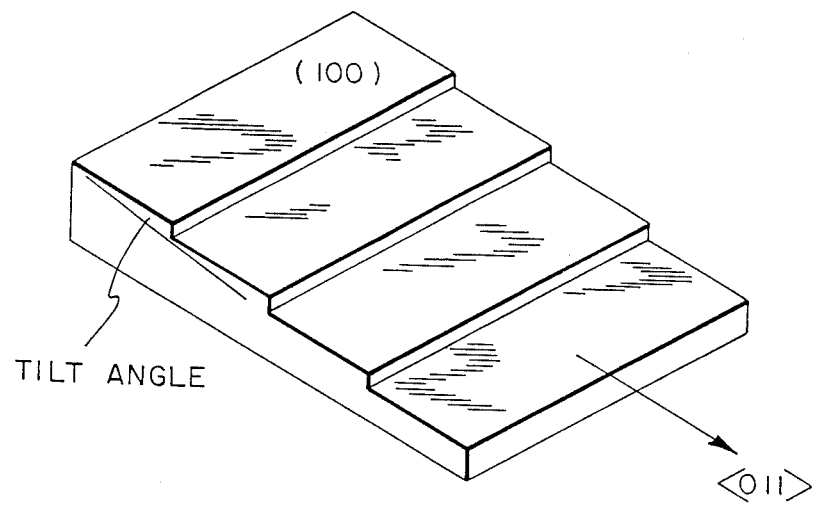

Dislocations in solids are characterized by two vectors, $\vec{A}$, and $\vec{B}$, the Burgers vector. A dislocation is a line defect, and the vector $\vec{A}$ gives the direction of the line locally. The vector $\vec{B}$, the Burgers vector, gives the direction and magnitude of the displacement of atomic planes needed to generate the dislocation. The most common dislocations in semiconductors such as GaAs and Si have Burgers vectors of the type $\frac{1}{2}a<011>$, where a is the lattice constant. Crystallographically, there are 12 equivalent <011> directions, one for each edge of a cube. Therefore, there can be 12 dislocations with Burgers vectors of this type:

$\vec{B} = \pm \frac{1}{2}a[011]$,
$\vec{B} = \pm \frac{1}{2}a[0\bar{1}1]$,
$\vec{B} = \pm \frac{1}{2}a[101]$,
$\vec{B} = \pm \frac{1}{2}a[\bar{1}01]$,
$\vec{B} = \pm \frac{1}{2}a[110]$,
$\vec{B} = \pm \frac{1}{2}a[1\bar{1}0]$, The first four of the Burgers vectors are in the (100) substrate plane, and these dislocations are not capable of propagating away from the interface. On the other hand, the last eight of these Burgers vectors are inclined at 45° from the interface and their associated dislocations are capable of propagating either toward or away from the interface. Since only the component of the Burgers vector projected onto the interface accommodates mismatch, dislocations with Burgers vectors inclined to the interface are inefficient at accommodating the mismatch. Therefore, dislocations with Burgers vectors in plane are highly desirable, since fewer are required and since they do not propagate into the epitaxial layer to adversely affect its quality.

The presence of ledges in the substrate surface help nucleate dislocations with in-plane Burgers vectors. It is known that steps in the Si {100} surface are predominantly double atomic layer steps which run parallel to <011>. The lattice parameter of Si is a=5.43 Å at room temperature. The mismatch between GaAs and Si is 4.2% and therefore, one dislocation (with $\vec{B}$ in plane) is needed approximately every 25 atomic planes. The atomic planes (within the same sublattice) are separated by a in the <011> direction and therefore the plane-to-

plane distance is $d_{pp}=1/\sqrt{2}a=3.84$ Å. Using the one dislocation every 25 plane rule, the average distance between dislocations to accommodate mismatch completely would be 96 Å. Since ledges are believed to be responsible for nucleating dislocations of the desired type, the average distance between ledges should be less than the required distance between dislocations to ensure that wherever a dislocation is needed, there will be a ledge to nucleate one of the proper type. Since the step height is known, one can calculate the minimum tilt angle to produce a sufficient step density. The minimum ledge length, l, is, from the above, 96 Å. Therefore the minimum tilt angle $\theta$ would be:

$$\theta = \tan^{-1} h/l = \tan^{-1} 2.72/96 = 1.62°$$

Therefore, any tilt angle (towards <011>) greater than 1.62° will produce enough ledges to ensure nucleation of the proper type of dislocation. Although we have calculated the minimum tilt angle, it is practical to use a larger angle, say 3 to 4 degrees, to allow for tolerance in cutting the crystal. Furthermore, the step edges do not necessarily occur at regular intervals and therefore to ensure that no ledge is greater in length than 96 Å, a tilt larger than the minimum should be used.

Figure 2:
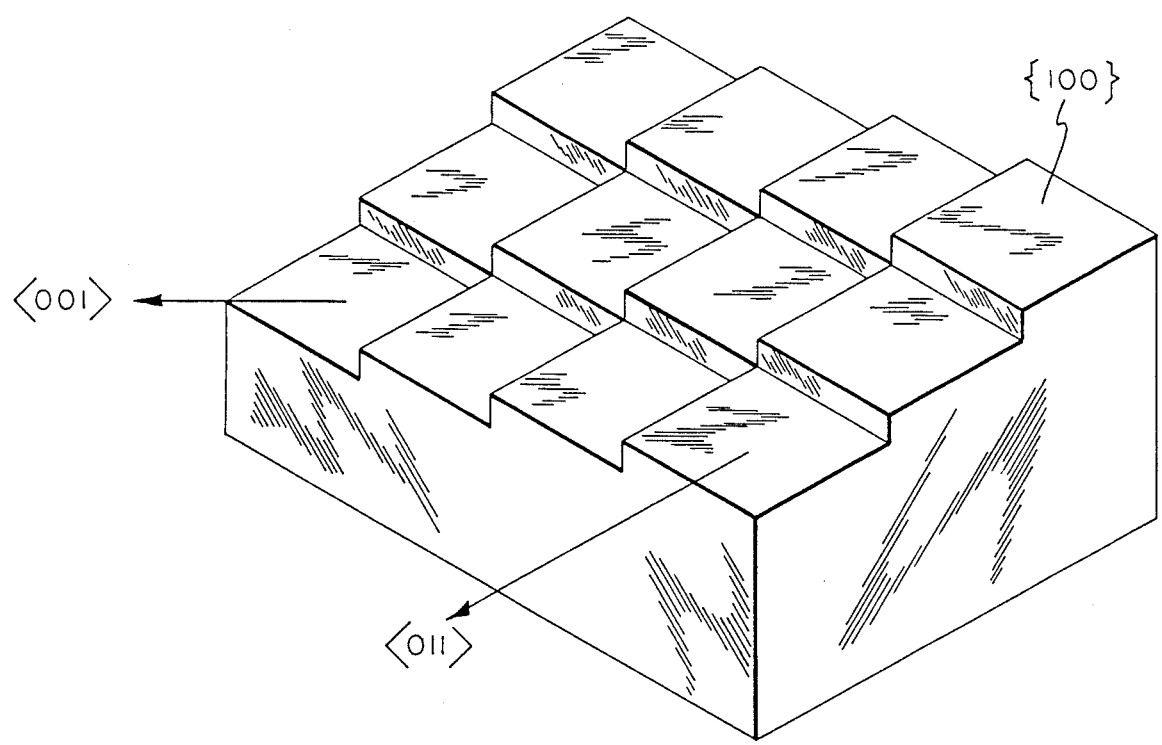
FIG. 2 shows a small portion of the surface of the substrate of 1A, but tilted toward the <001> direction.

The use of substrates tilted toward <011> results in steps that only run in one direction, and therefore only control half of the dislocations. The use of substrates misoriented toward <001> (i.e., equivalent directions [00$\bar{1}$], [001], [010], or [0$\bar{1}$0]) is an important improvement since this results in steps running in both directions as seen in FIG. 2. The minimum tilt angle $\phi$ in this case, is 1 modified from the case of a tilt toward <011>. To do this one takes the relationship between the tilt angles with respect to <001> and to <011>. From this we obtain Tan $\phi=\sqrt{2}$ Tan $\theta$, so if $\theta$ must be greater than 1.62°, then $\phi$ must be greater than $\phi=2.29°$. The use of these techniques results in lower dislocation densities as verified by transmission electron microscopy where dislocation densities for GaAs-on-Si as low as $10^3$ cm$^{-2}$ (which is better than many GaAs substrates) have been obtained.

In the examples hereof, three inch diameter silicon wafers and smaller germanium wafers were used. The epitaxial growth on silicon to be described was on 12-20 ohm-cm silicon with its applicable surface oriented 4 degrees off the (100) plane towards the [001] or equivalent direction. Suitable silicon wafers can be made by standard process sawing or can be purchased, for example, from Virginia Semiconductor Corp. of Fredericksburg, Va.

The epitaxial layer or layers can be grown using a conventional molecular beam epitaxy system, such as a Perkin Elmer 425 B molecular beam epitaxy system with a three inch wafer capability. The first step in performing polar on nonpolar growth is to employ a surface preparation technique for the Ge and Si which will produce a protective layer (such as an oxide) that can easily be removed to produce an atomically clean surface for the initiation of growth. In the case of Ge the oxides are very volatile, and thus no special preparation techniques are necessary. In contrast, the oxides of Si are very stable which means that very high temperatures are necessary to thermally desorb them. The requirements as to the maximum temperature needed to thermally desorb the Si oxide can be reduced somewhat by the use of special preparation techniques which produce very thin and volatile oxide layers which are much more readily desorbed.

Substrate surface preparation, can be in accordance with a number of known techniques, one being reported, for example, by Ishizaka, et al., Proc. 2nd International Symposium on Molecular Beam Epitaxy and Related Clean Surface Techniques, Tokyo, 1982. We refer to other suitable techniques in Fischer, et al., J. Appl. Phys. 58, 1, 1985. A free mounting technique, as reported by Erickson, et al., Summary abstract presented at International Conference on Molecular Beam Epitaxy, San Francisco, 1983, is preferred.

The protective oxide layers formed in the preparation steps are removed by heating the substrates immediately prior to growth to thermally desorb them. In the case of Ge this can be done by heating the substrate in an auxiliary chamber to about 630° C. (as read by a thermo-couple a the back of the block) for about 30 seconds. The substrate can then be immediately transferred to the growth chamber where it is again heated to about 500° C. The temperature can then be lowered to about 450°, and the growth initiated at a rate of about 0.1 micron/hr.

In the case of Si, much higher outgassing temperatures mutt be used. An auxiliary chamber can be employed for outgassing the silicon substrates. The temperature is raised to 1000° C. very briefly and then lowered. After this outgassing step the Si substrate is transferred into the growth chamber.

Once these outgassing steps are completed, the substrate temperature is lowered, and the growth can be initiated by depositing an As prelayer and starting with a low growth rate and temperature and a large As overpressure. (A Ga prelayer could alternatively be used, but the conditions will be different.) The growth can be initiated in the same manner for growth on both Ge and Si, except that the substrate temperature used during the initial slow growth layer is somewhat lower for Si than Ge. After the growth of a thin layer of GaAs under these conditions, the growth rate and growth temperature can be increased to 1 micron/hr. and 580° C., respectively.

As we described, for example, in Fischer, et al., J. Appl. Phys., 58, 1, 1985, antiphase domain formation should be suppressed by the above method of initiating the growth, as the predeposition of an As prelayer on the (100) surface should ensure that the growth begins with the anion plane. It is known, however, that Ga atoms, when impinging on a substrate coated with as many as 30 monolayers of As can diffuse through this coating to form GaAs. Therefore, although it is possible to form regions which begin with the cation plane, resulting in antiphase domains, the effect should be greatly suppressed. As noted above, various intervening layers can be applied between Si and the GaAs being deposited.

Figure 3:
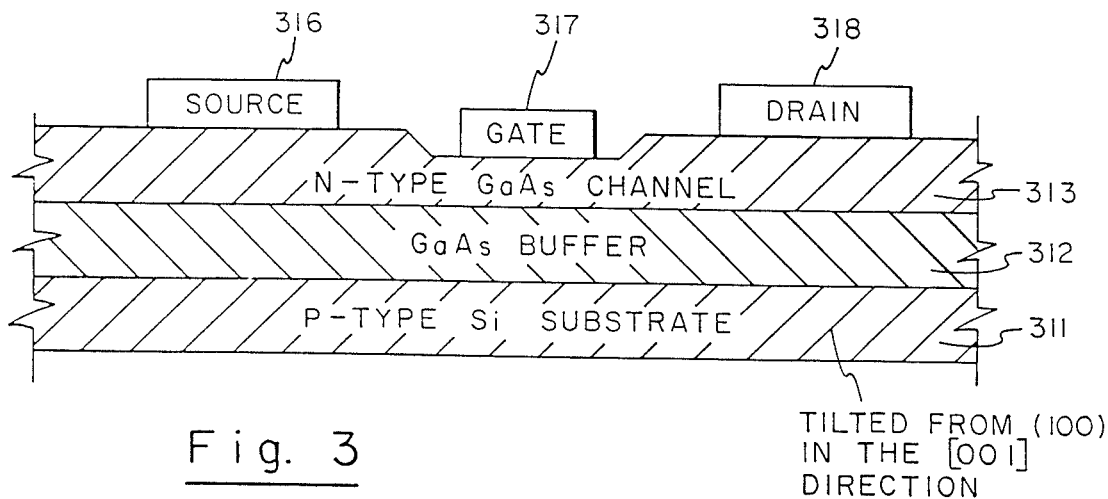
FIG. 3 shows a cross-section of a field-effect transistor in accordance with an embodiment of the present invention.
Figure 4:
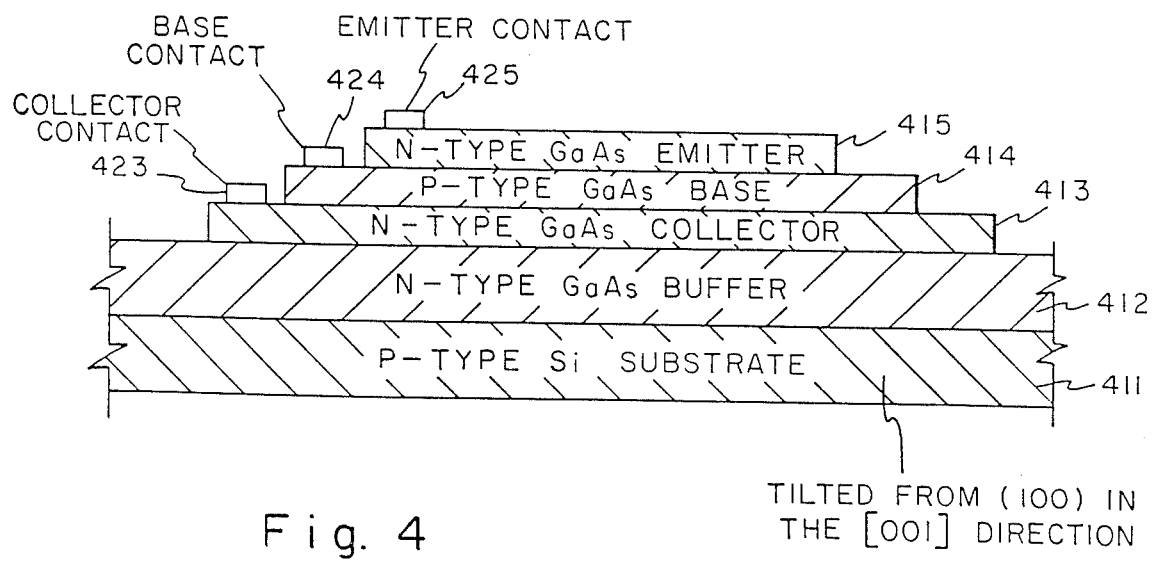
FIG. 4 shows a cross-section of a bipolar transistor in accordance with an embodiment of the present invention.
Figure 5:
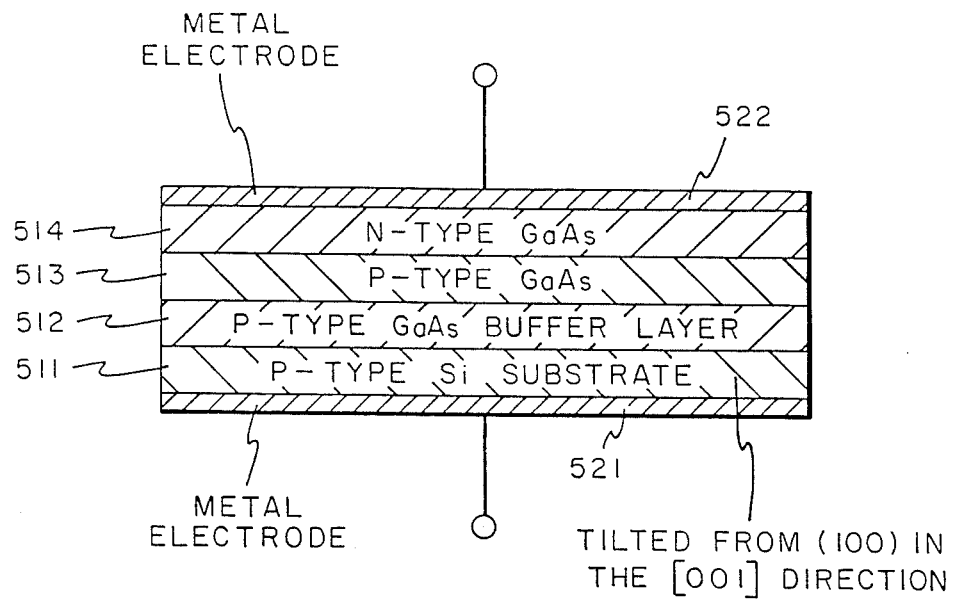
FIG. 5 shows a cross-section of a light-emitting diode in accordance with an embodiment of the invention.

After the initiation of growth, as described, various devices can be formed in the grown layer or further layers For example, FIGS. 3, 4 and 5 respectively illustrate, in a simplified form, a field-effect transistor, a bipolar transistor, and a light-emitting diode made using the technique hereof.

For the MESFET structure of FIG. 3, a substrate of p-type 12-20 ohm silicon with its surface tilted from (100) in the [001] direction by 4° has deposited thereon, consistent with the teachings hereof, a GaAs buffer layer 312 and an n-type GaAs channel layer 313.

Source, gate and drain electrodes 316, 317 and 318, respectively, are applied in conventional manner.

The bipolar transistor of FIG. 4 and the light emitting diode of FIG. 5 can also be fabricated in substantially conventional manner, except that the silicon substrate and initial GaAs deposition are implemented consistent with the teachings hereof. In FIG. 4 the high resistivity p-type silicon substrate 411 and gallium arsenide buffer layer 412 have further deposited thereon the layers 413, 414 and 415 which are, respectively, an n-type GaAs collector, p-type GaAs base, and an N-type GaAs emitter. Metal collector, base and emitter contacts 423, 424 and 425 are respectively applied to their associated layers.

In the light emitter of FIG. 5, a p-type silicon substrate 511 and a p-type gallium arsenide buffer layer 512 have deposited thereon a p-type GaAs layer 513 and then an n-type GaAs layer 514. Metal electrodes 521 and 522 are applied to opposing ends of the device and are typically light-transmissive. Again, it will be understood that the simplified representations set forth are to illustrate the types of devices that can be fabricated using substrates prepared and processed in accordance with the invention, and it will be understood that variations on these devices, for example to implement a laser, can readily be made, as is well known in the art.

The invention has been described with reference to particular preferred embodiments, but variations within the spirit and scope of the invention will occur to those skilled in the art. For example, while GaAs-on-Si has been featured and is important, the technique has application to many other material systems and operating conditions.

We claim:

1. A semiconductor device, comprising:
   a single crystalline substrate selected from the group consisting of silicon and germanium having a {100} crystallographic surface tilted in the <001> direction;
   at least one layer of III-V semiconductor material disposed over said surface; and
   a transistor device formed in said at least one layer of III-V semiconductor material.

2. The semiconductor device as defined by claim 1, wherein said substrate is silicon and said at least one layer of III-V semiconductor material includes a layer of gallium arsenide.

3. The semiconductor device as defined by claim 2, wherein the angle of the tilt is at least 2.29 degrees.

4. The semiconductor device as defined by claim 1, wherein said transistor device is a field-effect transistor.

5. The semiconductor device as defined by claim 2, wherein said transistor device is a field-effect transistor.

6. The semiconductor device as defined by claim 3, wherein said transistor device is a field-effect transistor.

7. The semiconductor device as defined by claim 1, wherein said transistor device is a bipolar transistor.

8. The semiconductor device as defined by claim 2, wherein said transistor device is a bipolar transistor.

9. The semiconductor device as defined by claim 3, wherein said transistor device is a bipolar transistor.

10. A semiconductor device, comprising:
    a single crystalline substrate selected from the group consisting of silicon and germanium having a crystallographic surface tilted in the <001> direction;
    at least one layer of III-V semiconductor material disposed over said surface; and
    a light-emitting device formed in said at least one layer of III-V semiconductor material.

11. The semiconductor device as defined by claim 10, wherein said substrate is silicon and said at least one layer of III-V semiconductor material includes a layer of gallium arsenide.

12. The semiconductor device as defined by claim 11, wherein the angle of the tilt is at least 2.29 degrees.

* * * * *

UNITED STATES PATENT AND TRADEMARK OFFICE
CERTIFICATE OF CORRECTION

PATENT NO. : 4,872,046
DATED : October 3, 1989
INVENTOR(S) : Morkoc et al.

It is certified that error appears in the above—identified patent and that said Letters Patent is hereby corrected as shown below:

Col. 4, line 68 change "a" to $--1/\sqrt{2}a--$

Col. 8, line 27 after "a" insert $--\{100\}--$

Signed and Sealed this

Eleventh Day of June, 1991

*Attest:*

HARRY F. MANBECK, JR.

*Attesting Officer*     *Commissioner of Patents and Trademarks*